United States Patent [19]

Tsutsui

[11] Patent Number: 4,564,284
[45] Date of Patent: Jan. 14, 1986

[54] SEMICONDUCTOR EXPOSURE APPARATUS

[75] Inventor: Shinji Tsutsui, Yokohama, Japan

[73] Assignee: Canon Kabushiki Kaisha, Tokyo, Japan

[21] Appl. No.: 741,218

[22] Filed: Jun. 5, 1985

Related U.S. Application Data

[63] Continuation of Ser. No. 531,298, Sep. 12, 1983, abandoned.

[30] Foreign Application Priority Data

Sep. 12, 1983 [JP] Japan .................... 57-162029

[51] Int. Cl.⁴ .................. G03B 27/52; G03B 27/20
[52] U.S. Cl. ........................... 355/30; 355/53; 355/91
[58] Field of Search ............ 355/78, 79, 91, 125, 355/53, 30; 430/5, 311, 319; 428/65, 698

[56] References Cited

U.S. PATENT DOCUMENTS 4,432,635  2/1984  Mayer .................. 355/30
4,496,239  1/1985  Isohata et al. .......... 355/30
4,503,335  3/1985  Takahashi ............ 355/30 X Primary Examiner—L. T. Hix
Assistant Examiner—Della Rutledge
Attorney, Agent, or Firm—Fitzpatrick, Cella, Harper & Scinto

[57] ABSTRACT

In a semiconductor exposure apparatus having chucks for holding a mask and a wafer, respectively, the holding portion of at least one of the chucks has a coefficient of linear expansion equal to or smaller than the coefficient of linear expansion of the bodies held. Particularly, the coefficient of linear expansion of the holding portion of the chuck should preferably be of a small absolute value, but even where the absolute value of the coefficient of linear expansion is great, the chucks are usable by providing temperature control.

19 Claims, 3 Drawing Figures

SEMICONDUCTOR EXPOSURE APPARATUS

This application is a continuation of application Ser. No. 531,298 filed Sept. 12, 1983, now abandoned.

BACKGROUND OF THE INVENTION

1. Field of the Invention

This invention relates to a semiconductor exposure apparatus used in an integrated circuit manufacturing process and having chucks designed to suppress the magnification error for the pattern of the preceding step when the pattern of a mask is transferred onto a semiconductor wafer.

2. Description of the Prior Art

In integrated circuit manufacturing, the step of projecting and transferring a mask pattern onto a semiconductor wafer substrate is done plural times. At this time, it is necessary that the mask pattern of the next step be highly accurately aligned over the entire surface of the wafer relative to the mask pattern transferred onto the wafer in the preceding step.

Generally, a semiconductor wafer is adsorbed to a wafer chuck which is a support means for fixedly supporting the wafer and, once the wafer is held to the wafer chuck, the vacuum is not released until exposure is completed. Heretofore, the wafer chuck has been made of a metal, such as aluminum or stainless steel, which is very sensitive to the thermal expansion and contraction caused by fluctuation of the ambient temperatures as compared with the wafer. That is, it has been confirmed that when the wafer chuck creates a minute amount of expansion and contraction with the wafer held to the wafer chuck, the wafer also creates expansion and contraction exceeding the elongation percentage intrinsic to the wafer. For example, let it be assumed that the temperature around the chuck has risen by 0.2° C. from after a silicon wafer has been adsorbed to a wafer chuck made of aluminum until exposure is started, and the temperatures of the wafer and wafer chuck have also risen correspondingly. Heretofore, in such a case, due to the coefficient of linear expansion ($2.5 \times 10^{-6}/°C$.) of the silicon wafer, the amount of expansion of a wafer of 5 inches has been only about 0.06 $\mu$m and this has been considered to be a negligible amount. At this time, the wafer chuck (whose coefficient of linear expansion is $23 \times 10^{-6}/°C$.) expands to about 0.6 $\mu$m and the wafer is pulled by the friction force with the chuck and exhibits an amount of elongation approximate thereto. Accordingly, if exposure is effected in such condition, a magnification error occurs between the pattern of the preceding step and the pattern of the current step and highly accurate alignment of the wafer over the entire surface thereof becomes impossible. In recent years, various methods of highly accurately aligning a mask pattern and a wafer pattern by controlling the temperature of the wafer have been devised. However, if the temperature of the wafer chuck is changed after the wafer has been fixed to the wafer chuck, a great amount of elongation occurs in the wafer chuck which therefore, the wafer is pulled thereby, and has led to the disadvantage that an amount of expansion and contraction greater than necessary occurs.

For this reason, it has been very difficult to achieve highly accurate alignment of the wafer over the entire surface thereof in a case where use is made of a wafer chuck made of a metal such as stainless steel or aluminum.

A similar tendency seems to occur not only in the wafer and wafer chuck but also in the mask and mask chuck although there is difference in degree.

SUMMARY OF THE INVENTION

It is an object of the present invention to prevent, after a body such as a mask or a wafer has been vacuum-adsorbed or held to a chuck, the held body from creating an amount of expansion and contraction exceeding the amount of expansion and contraction by its own temperature change due to a temperature change of the chuck.

It is another object of the present invention to provide a semiconductor exposure apparatus in which the magnification error for the pattern of the preceding step is suppressed when a mask pattern is transferred onto a wafer.

The invention will become fully apparent from the following detailed description thereof taken in conjunction with the accompanying drawings.

DESCRIPTION OF THE PREFERRED EMBODIMENTS

Figure 1:
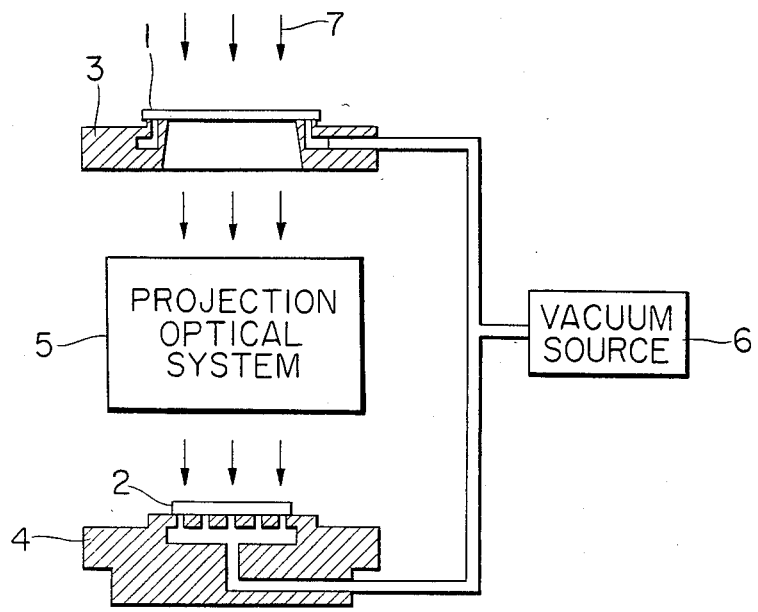
FIG. 1 illustrates a projection type semiconductor exposure apparatus which is an embodiment of the present invention.

Referring to FIG. 1, a photomask 1 and a wafer 2 are vacuum-adsorbed that is, held by a negative pressure to a mask chuck 3 and a wafer chuck 4, respectively, by a vacuum source 6, and the mask pattern of the mask chuck 3 to which a light beam 7 for exposure is applied is projected onto the wafer 2 by a projection optical system 5.

Now, embodiments of the chuck of the present invention will be shown below. Herein, only a case where the material of the semiconductor wafer is silicon is considered.

In a first embodiment, ceramics, silicon or Hastelloy A is employed as the material of the wafer chuck. The standard composition of Hastelloy A is Ni 55–59%, Mo 18–12%, C 0.04–0.15% and Fe 18–22%. As regards the coefficients of linear expansion of these materials, the coefficient of linear expansion of ceramics, particularly, silicon nitride ($Si_3N_4$) is $3.0 \times 10^{-6}/°C$. (Industrial Materials, 30.25 (1982)), that of silicon is $2.5 \times 10^{-6}/°C$. (Physical Constant Table) and that of Hastelloy A is $2.7 \times 10^{-6}/°C$. (Mechanical Engineering Handbook, 6th Edition), and these are substantially coincident with the coefficient of linear expansion ($2.5 \times 10^{-6}/°C$.) of silicon wafer. The use of a wafer chuck formed of these materials results in obtainment of the following effect.

First, let it be assumed that the wafer is held to the wafer chuck, whereafter the temperature around the chuck is changed by some influence or other and the temperatures of the wafer chuck and the wafer are correspondingly changed. Heretofore, the wafer chuck has been made of aluminum or stainless steel and particularly in the case of aluminum, the wafer chuck has a coefficient of linear expansion about ten times as great as that of silicon and therefore, even if the temperature change is small, the amount of expansion and contraction of the chuck is significant and the wafer also is pulled by the expansion and contraction of the chuck, and such temperature change leads to a magnification error. Accordingly, by using as the material of the wafer chuck the aformentioned material having a coefficient of expansion approximate to the coefficient of expansion of the wafer, the amounts of expansion and contraction of the wafer chuck and the wafer are made smaller than the amount of expansion and contraction of the conventional chuck for some temperature change and are made innegligible and, since substantially the same amount of expansion and contraction occurs to the wafer and the chuck simultaneously, the stress by heat does not remain in the wafer due to the expansion and contraction thereof.

Further, in an apparatus wherein the temperature of the wafer or the wafer chuck is controlled to purposely achieve the expansion and contraction of the wafer and thereby correct the magnification error, even when a temperature change is imparted to the wafer after being fixed to the wafer chuck, if the wafer chuck is formed of said material, the expansion and contraction of the wafer is not hampered by the chuck and therefore, an accurate preestimate of the amount of expansion and contraction thereof becomes possible and highly accurate correction of the magnification error becomes possible.

Figure 2:
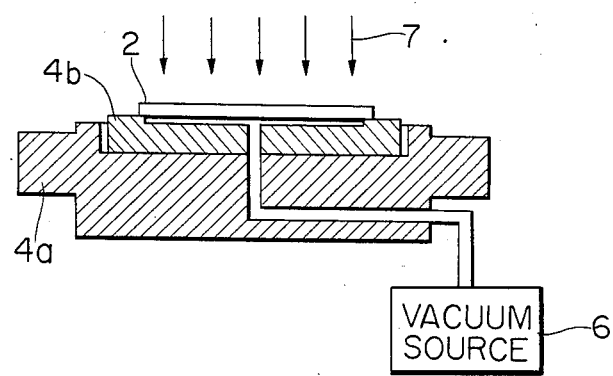
FIG. 2 shows an embodiment of the wafer chuck according to the present invention which has a two-piece structure.

However, where ceramics or silicon is used for the wafer chuck, it would be very difficult to form the entire chuck of such material because these materials are not easy to machine. However, the entire chuck need not always be formed of a single material, but only the portion thereof which holds the wafer may be formed of a required material and the other portion thereof may be formed of a conventionally used metal, for example, whereby a sufficient effect may be obtained. Of course, however, the portion of the wafer chuck which holds the wafer must be of a sufficient thickness not to transfer the deformation of the metal to the wafer. An example of the wafer chuck having such two-piece structure is shown in FIG. 2. In FIG. 2, reference character $4a$ designates the metal portion of the wafer chuck and reference character $4b$ denotes the ceramics portion of the wafer chuck.

Description will now be made of a second embodiment in which the material of the mask chuck is ceramics or invar. Soda-lime glass, LE-30 or quartz glass is generally used as the material of the photomask, but herein LE-30 and quartz glass will be considered. Among ceramics, the coefficient of linear expansion of silicon carbide (SiC) is $4.0 \times 10^{-6}/°C$. (which somewhat differs depending on the type of crystal and the sintering method) and this is substantially coincident with the coefficient of linear expansion $3.7 \times 10^{-6}/°C$. of LE-30, and the coefficient of linear expansion of invar is $0.9 \times 10^{-6}/°C$. (Mechanical Engineering Handbook, 6th Edition; invar has its coefficient of the components thereof) and this is approximate to the coefficient of linear expansion $0.5 \times 10^{-6}/°C$. of quartz glass. The standard composition of invar is C<0.20%, Mn 0.5%, Ni 36% and Fe remainder. Accordingly, by forming the mask chuck by the use of these materials, there is obtained an effect similar to that of the above-described first embodiment.

Description will now be made of a third embodiment in which super invar, which is a metal of low expansion, is used as the material of the mask chuck or the wafer chuck, the coefficient of linear expansion of this material is $-0.01 \times 10^{-6}/°C$. (Mechanical Engineering Handbook, 6th Edition), which is a very samll value as compared with coefficient of linear expansion of silicon wafer or quartz glass mask. Super invar comprises invar with Co added thereto and its coefficient of linear expansion is lowest for Co 5%, Ni 31.5% and Fe 63.5%. Therefore, if a mask chuck or a wafer chuck formed of super invar, expansion and contraction will hardly occur in the two chucks even if the ambient temperature fluctuates after the mask or the wafer has once been fixed to the chuck and accordingly, the expansion and contraction of the photomask or the wafer substrate fixed thereto by vacuum adsorption will also be suppressed. Thus, the use of a mask chuck or a wafer chuck formed of super invar makes the expansion and contraction of the mask or the wafer very stable for over temperature and easily prevents occurrence of the magnification error resulting from temperature change.

As described above, by a material having an absolutely low coefficient of linear expansion equal to or smaller than that of the photomask or the wafer being used as the material of the mask chuck or the wafer chuck, the planar expansion and contraction of the mask and wafer resulting from temperature changes is reduced as compared with the conventional case where metal chucks are used, and the magnification error occurring when a mask pattern is projected and transferred onto the wafer becomes smaller and thus, more highly accurate alignment can be achieved over the entire surface of the wafer.

In the above-described embodiments, silicon single crystal has typically been used as the material of the semiconductor wafer substrate, but the same conception can also apply to other wafer substrates such as GaAs, SoS, quartz substrate, etc. and a sufficient effect can be expected by carrying out the present invention.

In the foregoing, description has been made of the embodiments in which the coefficient of linear expansion of the holding portion of the chuck is of a small absolute value substantially coincident with the coefficient of linear expansion of the mask or the wafer, but where the coefficient of linear expansion of the portion of the chuck is of a great absolute value substantially coincident with the coefficient of linear expansion of the mask or the wafer, such chuck can be used by controlling the temperature of the mask or the wafer.

Also, where the coefficient of linear expansion of the adsorbing portion of the chuck is smaller than the coefficient of linear expansion of the mask or the wafer and the absolute value to that coefficient of linear expansion is of a great absolute value, such chuck is usable by temperature control.

Controlling the temperature of the mask or the wafer is useful not only where the coefficient of linear expansion of the holding portion of the chuck is of a high absolute value, but also where it is of a low absolute value.

Figure 3:
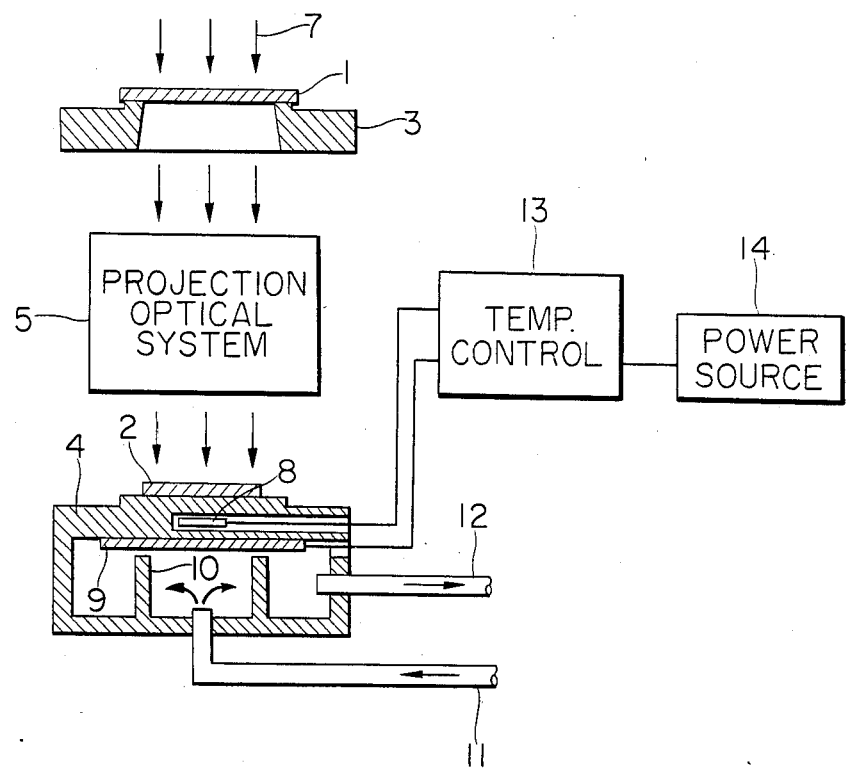
FIG. 3 shows an example of the arrangement for limiting the temperature of the chuck.

The above-described temperature control may be effected in a manner as shown, for example, in FIG. 3. FIG. 3 shows a semiconductor exposure apparatus in which only the wafer chuck is temperature-controlled. The wafer chuck 4 fixedly supports the wafer 2 by vacuum and, in the interior thereof, there are provided a heating resistor 9 which is a heating means for making the temperature of the wafer chuck higher by several degrees than the room temperature, a cooling air inlet 11 and a cooling air outlet 12 for circulating air of normal temperature as cooling air, and a platinum temperature measuring resistor 8 for detecting the temperature of the interior of the chuck.

The mask pattern and the wafer pattern are aligned and at the same time, the magnification errors of the two patterns are read, and the temperature width to be varied is calculated from the values of the magnification errors and the coefficient of linear expansion of the wafer, and then a temperature having this value added to the current temperature of the chuck is set by a temperature control device 13.

Thereafter, the temperature control device 13 is operated and the temperature of the wafer chuck is controlled so that the difference between the temperature detected by the platinum temperature measuring resistor 8 and the set temperature becomes zero. In FIG. 3, reference numeral 10 designates a radiator plate and reference numeral 14 denotes a power source.

In the above-described embodiment, air cooled by a cooling device, instead of the air of normal temperature, may be used as the cooling air. In such case, the cooling speed of the chuck is further increased and the temperature control below the room temperature becomes possible and therefore, efficient correction of the magnification error in a wider range is possible.

The cooling device referred to herein need not always have the temperature controlling function, but a sufficient effect may be provided even by a simple cooling device utilizing, for example, the adiabatic expansion of air.

What we claim is:

1. A semiconductor exposure apparatus having:
a mask clutch for holding a mask; and a wafer chuck for holding a wafer;
the holding portion of at least one of said chucks having a coefficient of linear expansion substantially coincident with the coefficient of linear expansion of the mask or the wafer held thereby.

2. A semiconductor exposure apparatus according to claim 1, wherein the coefficient of linear expansion of said holding portion of said chuck has a small absolute value.

3. A semiconductor exposure apparatus according to claim 2, wherein said holding portion includes a ceramic.

4. A semiconductor exposure apparatus according to claim 2, wherein said holding portion includes silicon.

5. A semiconductor exposure apparatus according to claim 2, wherein said holding portion includes Hastelloy A.

6. A semiconductor exposure apparatus according to claim 2, wherein said holding portion includes invar.

7. A semiconductor exposure apparatus having:
a mask chuck for holding a mask; and
a wafer chuck for holding a wafer;
the holding portion of at least one of said chucks having a coefficient of linear expansion smaller than the coefficient of linear expansion of the mask of the wafer held thereby.

8. A seminconductor exposure apparatus according to claim 7, wherein the coefficient of linear expansion of said holding portion of said chuck has a small absolute value.

9. A semiconductor exposure apparatus according to claim 8, wherein said holding portion includes super invar.

10. A semiconductor exposure apparatus having:
a mask chuck for holding a mask;
a wafer chuck for holding a wafer;
the holding portion of at least one of said chucks having a coefficient of linear expansion substantially coincident with the coefficient of linear expansion of the mask or the wafer held thereby; and
temperature control means for controlling the temperature of at least one of said chucks.

11. A seminconductor exposure apparatus having:
a mask chuck for holding a mask;
a wafer chuck for holding a wafer;
the holding portion of at least one of said chucks having a coefficient of linear expansion smaller than the coefficient of linear expansion of the mask or the wafer held thereby; and
temperature control means for controlling the temperature of at least one of said chucks.

12. A holding apparatus for holding a seminconductor mask or wafer, the apparatus comprising:
a chuck for holding the mask or wafer, said chuck including a holding portion having a coefficient of linear expansion substantially coincident with the coefficient of linear expansion of the mask or wafer held thereby; and
means for cooperating with said holding portion for applying a megative pressure thereto to hold the mask or wafer on said holding portion.

13. A holding apparatus according to claim 12, further comprising temperature control means for controlling the temperature of said chuck.

14. A holding apparatus for holding a semiconductor mask or wafer, the apparatus comprising:
a chuck for holding the mask or wafer, said chuck including a holding portion having a coefficient of linear expansion smaller than the coefficient of linear expansion of the mask or wafer held thereby; and
means for cooperating with said chucks to apply a negative pressure to said holding portion to hold the mask or wafer on said holding portion.

15. A holding apparatus according to claim 14, further comprising temperature control means for controlling the temperature of said chuck.

16. A holding apparatus for holding at least one of a semiconductor mask and wafer, said apparatus comprising:
a chuck for holding said at least one of said mask and wafer, said chuck including a holding portion having a coefficient of linear expansion substantially coincident with the coefficient of linear expansion of said at least one of said mask and wafer held thereby; and
means for securing said at least one of said mask and wafer on said holding portion.

17. A holding apparatus according to claim 16, further comprising temperature control means for controlling the temperature of said chuck.

18. A holding apparatus for holding at least one of a semiconductor mask and wafer, the apparatus comprising:
a chuck for holding said at least one of said mask and wafer, said chuck including a holding portion having a coefficient of linear expansion smaller than the coefficient of linear expansion of said at least one of said mask and wafer held thereby; and
means for securing one of the mask and wafer on said holding portion.

19. A holding apparatus according to claim 18, further comprising temperature control means for controlling the temperature of said chuck.

* * * * *

UNITED STATES PATENT AND TRADEMARK OFFICE
CERTIFICATE OF CORRECTION

PATENT NO. : 4,564,284  
DATED : January 14, 1986  
INVENTOR(S) : SHINJI TSUTSUI Page 1 of 2

It is certified that error appears in the above-identified patent and that said Letters Patent is hereby corrected as shown below:

Column 1, line 23, change "adsorbed" to --held--;
lines 30-31, change "tem-peratures" to --temperature--;
line 49, change "expands to about" to --expands by about-- and change --pulled by the" to --pulled due to the--;
line 62, change "which therefore," to --and therefore,--; and
line 63, change "and has led" to --which has led--.

Column 2, line 37, change "-adsorbed to" to ---adsorbed, that--.

Column 4, line 4, change "samll" to --small--;
line 9, change "Therefore, if" to --Therefore, in--;
line 18, change "for over" to --over--;
line 50, change "adsorbing" to --holding--; and
line 55, change "temperture" to --temperature--.

UNITED STATES PATENT AND TRADEMARK OFFICE
CERTIFICATE OF CORRECTION

PATENT NO. : 4,564,284  
DATED : January 14, 1986  
INVENTOR(S) : SHINJI TSUTSUI It is certified that error appears in the above-identified patent and that said Letters Patent is hereby corrected as shown below:

Column 5, line 27, change "temperature controlling" to --temperature-controlling--;

line 31, change "What we claim is:" to --What I claim is:--;

line 33, change "a mask clutch" to --a mask chuck--;

line 59, change "of the wafer" to --or the wafer--; and line 60, change "A seminconductor" to --A semiconductor--.

Column 6, line 8, change "A seminconductor" to --A semiconductor--;

lines 16-17, change "seminconductor" to --semiconductor--; and line 24, change "megative" to --negative--.

Cover page, [30], change "Sep. 12, 1983 [JP]" to --Sep. 16, 1982 [JP]--.

Signed and Sealed this

Ninth Day of September 1986

[SEAL]

Attest:

DONALD J. QUIGG

Attesting Officer     Commissioner of Patents and Trademarks